United States Patent [19]

Jeffcoat

[11] Patent Number: 5,775,942
[45] Date of Patent: Jul. 7, 1998

[54] CLAMP JAW, LEVER BYPASS METER SOCKET

[75] Inventor: Walter Jeffcoat, Vidalia, Ga.

[73] Assignee: Thomas & Betts Corporation, Memphis, Tenn.

[21] Appl. No.: 710,080

[22] Filed: Sep. 11, 1996

[51] Int. Cl.⁶ .................................................. H01R 29/00
[52] U.S. Cl. ........................... 439/517; 361/668; 361/669
[58] Field of Search ................................ 439/517, 518; 361/662, 664, 666, 668, 669

[56] References Cited

U.S. PATENT DOCUMENTS

| | | | |
|---|---|---|---|
| 3,003,085 | 10/1961 | Rund | 361/662 |
| 3,150,289 | 9/1964 | Waldrop | 361/666 |
| 3,170,090 | 2/1965 | Waldrop | 361/666 |
| 3,281,550 | 10/1966 | Waldrop | 200/51.1 |
| 5,571,031 | 11/1996 | Robinson et al. | 439/517 |

OTHER PUBLICATIONS

Murray Electrical Products Catalog, entitled "Meter Sockets", undated.
Landis & Gyr Catalog, entitled "Meter Mounting Devices", Apr. 15, 1978.
Milbank Manufacturing Co. Catalog, entitled "Meter Mounting Equipment", undated.

*Primary Examiner*—Neil Abrams
*Assistant Examiner*—T. C. Patel
*Attorney, Agent, or Firm*—Hoffman & Baron, LLP

[57] ABSTRACT

A clamp jaw/lever bypass meter socket includes an insulative base and a plurality of line and load end jaw-type releasable contacts for receiving the blades of a meter. Each of the contacts includes a stationary contact and a movable contact pivotally coupled to the stationary contact. The meter socket also includes a spring biasing said movable contact to be in a clamped position with the stationary contact. The meter socket includes a meter bypass having bypass cams coupled to a manually rotatable shaft. The bypass cams are movable from an operating position whereby the jaw-type contacts one clamped and current flows through a meter and a bypass position in which the bypass cams are electrically shorting the line and load contacts for the same phase for changing or testing a meter without service interruption. Both the stationary and movable contacts are a one-piece construction. The movable contacts include supplemental contact arms so that current is divided between the stationary and movable contacts. Additionally, the insulative base includes recessed cavities formed therein for receiving the jaw-type contact assemblies. Lastly, the bypass cams are permanently engaged with the load end contacts and the bypass mode can be achieved either by engaging the contact assemblies sequentially or simultaneously.

20 Claims, 5 Drawing Sheets

CLAMP JAW, LEVER BYPASS METER SOCKET

BACKGROUND OF THE INVENTION

1. Field of the Invention

The present invention relates to a watt-hour meter socket generally, and more particularly to an improved meter socket having clamp jaws and a lever bypass having distinct advantages over known meter sockets.

2. Description of the Prior Art

Meter sockets having locking jaws for receiving the bayonet or blade contacts of a watt-hour meter are well known. Furthermore, meter sockets having a lever bypass are also well known. Such a meter socket is disclosed in U.S. Pat. No. 3,281,550, issued on Oct. 25, 1966 to Waldrop.

Meter sockets are generally located in a rectangular enclosure having an opening in the top panel for receiving the line cables and an opening in the bottom panel for receiving the load cables. The meter socket is mounted to a back panel of the enclosure and a removable front panel has an opening for receiving the dome portion of meter which extends therethrough when coupled to the meter socket.

The meter socket generally includes six jaw-type terminals for receiving the blade contacts of the meter. As discussed in U.S. Pat. No. 3,281,550, the meter socket also includes bypass conductor members to short the line and load contact of the same phase by operation of a lever. In this particular instance, the bypass conductor members are moved to an open position by placing an insulative material against the bypass member to move the cantilevered bypass member out of electrical contact with the load side jaw-type terminals.

The above-described meter socket as well as other well known meter sockets suffer a variety of disadvantages. Firstly, the jaw release terminals are often made from a multiple component structure which is either brazed, staked riveted together. These junctions to couple the components are often poorly made causing very high resistance at the junction. Furthermore, these component part junctions are potential points of failure within the meter socket.

Secondly, another disadvantage of presently available jaw-type contact meter sockets is current flow through component parts other than the contacts. For example, the movable contact portion may include a spring to bias the movable contact with respect to a stationary contact to form the jaw-type contact assembly. Under certain conditions, current may flow through the spring thus causing the spring to overheat and possibly fail as a result.

Yet another disadvantage of known meter sockets is the problem of contact terminals moving when subjected to rotational forces exerted thereon when a cable is being attached to the terminal connector assembly. Known designs use small screws to hold the contact terminals to an insulated block assembly. These rotational forces are often large enough to break the small screws causing the terminal to fall off the insulated block.

The present invention is directed to overcoming each of the disadvantages set forth above as well as other disadvantages not specifically described herein but which will become readily apparent to those of ordinary skill in the art in view of the detailed description of the present invention.

OBJECTS AND SUMMARY OF THE INVENTION

It is an object of the present invention to provide a meter socket having a relatively low resistance jaw-type contact assembly.

2

It is a further object of the present invention to provide a meter socket which divides the current flow through the stationary and movable contacts of the jaw-type contact assembly.

It is another object of the present invention to provide a meter socket which reduces arcing in the bypass mode by using cams which are permanently engaged with the load end stationary contact of the jaw-type contact assembly.

It is yet a further object of the present invention to provide a meter socket having an improved insulated base for receiving the jaw-type contact assemblies. The line and load stationary contact assemblies are seated in recessed cavities formed in the insulated block for better retention and improved alignment of the conductor terminals and contact assemblies.

It is still another object of the present invention to provide a meter socket having a bypass lever mechanism in which the force necessary to overcome the springs in the jaw-type contact assemblies may be reduced.

It is still a further object of the present invention to provide a meter socket in which the operating handle has a positive interlock with a meter socket bracket when placed in the bypass mode of operation.

It is yet another object of the present invention to provide a meter socket having meter retaining clips which hold the meter in place when the jaw release/bypass mechanism is engaged.

It is still a further object of the present invention to provide a meter socket wherein the meter socket jaw contacts clamp onto the meter bayonets prior to engaging the bypass.

It is another object of the present invention to provide a meter socket wherein the meter socket jaw contacts release the meter bayonets after engaging the bypass.

It is a further object of the present invention to provide a meter socket wherein the bypass is designed to carry full rated current.

It is still another object of the present invention to provide a meter socket having an insulated block design which positively interlocks the component parts of the meter socket thereon.

In accordance with one form of the present invention, a meter socket assembly includes a block of insulative material and a plurality of line and load jaw-type releasable contacts for receiving the blades of a meter. Each of the contacts are mounted to the block and include a stationary contact and a movable contact mechanically and electrically connected to the stationary contact. Furthermore, the releasable contacts include a biasing means which biases each of the moveable contacts to be in clamped relation with its associated stationary contact. The meter socket assembly also includes a meter bypass means having bypass cams coupled to a manually rotatable shaft. The bypass cams are moveable from an operating position whereby the jaw-type contacts are clamped and current flows through a meter and a bypass position in which the bypass cams are electrically shorting the line and load end contacts of the same phase for changing or testing a meter without service interruption.

The jaw-type releasable contacts are preferably formed from a stationary contact and a moveable contact, each of which is formed in a one-piece construction. Furthermore, the moveable contact includes supplemental contact arms which are in electrical contact with the stationary contacts so that current is substantially divided between the stationary contact and moveable contact when flowing through the contact assembly. The stationary contact includes an elongate body having a substantially u-shaped lower portion. The elongate body further includes wings extending substantially perpendicular to the body on opposite side portions thereof. The supplemental contact arms of the moveable contacts mechanically and electrically engage the wings of the stationary contacts.

The block of insulative material of the meter socket assembly includes a plurality of recessed cavities formed therein for receiving the lower portion of the stationary contacts. A stationary contact portion of the contact assemblies also includes a conductor terminal. The insulative block includes a plurality of recessed cavities for receiving both the lower portion of the stationary contacts and the conductor terminals. These cavities in the block provide positive resistance against rotational forces exerted on the stationary contact and conductor terminal when a cable is being attached to the conductor terminals and maintains accurate alignment of the jaw-type contacts.

As previously noted, the bypass means includes a plurality of bypass cams. The bypass cams are permanently electrically coupled with the load end stationary contacts. Furthermore, the bypass cams are generally semi-circular in shape. The bypass cams further include lobes positioned thereon. the bypass cam lobes are arranged to engage the contact assemblies either simultaneously or sequentially. If the contact assemblies are engaged sequentially upon operation of the bypass means, the force necessary to overcome the biasing means associated with each of the moveable contacts of the contact assembly may be reduced. Additionally, since the bypass cams are permanently engaging the load side contacts, arcing, if it occurs, is limited to the three line side contacts.

The meter socket assembly also includes a meter socket bracket coupled to the block for supporting a meter on the socket assembly when the bypass means is in the bypass position thereby releasing the jaw-type contact assemblies. The meter socket bracket may also include a positive interlock with an operating hand of the meter bypass means to the lock the handle in the bypass position. The meter socket brackets also include a pair of retaining clips for holding the meter in place in the socket.

A preferred form of the meter socket, as well as other embodiments, objects, features and advantages of this invention, will be apparent from the following detailed description of illustrative embodiments thereof, which is to be read in connection with the accompanying drawings.

DETAILED DESCRIPTION OF THE PREFERRED EMBODIMENTS

The present invention is a clamp jaw, lever bypass meter socket for use with watt-hour electrical meters. Typically, the meter socket is housed in an enclosure (not shown) in the form of a box wherein the meter socket is mounted to the back wall of the box. The top of the box generally includes an opening formed therein for attachment of a conduit carrying power conductors to the line side of the meter socket mounted therein. The back, sides and bottom of the enclosure include knockouts for attachment of conduits for carrying of the load end conductors connected to the meter socket. A cover having an opening for receiving the dome portion of a watt-hour meter is mounted to the enclosure front opening to lock the meter in place.

Figure 1:
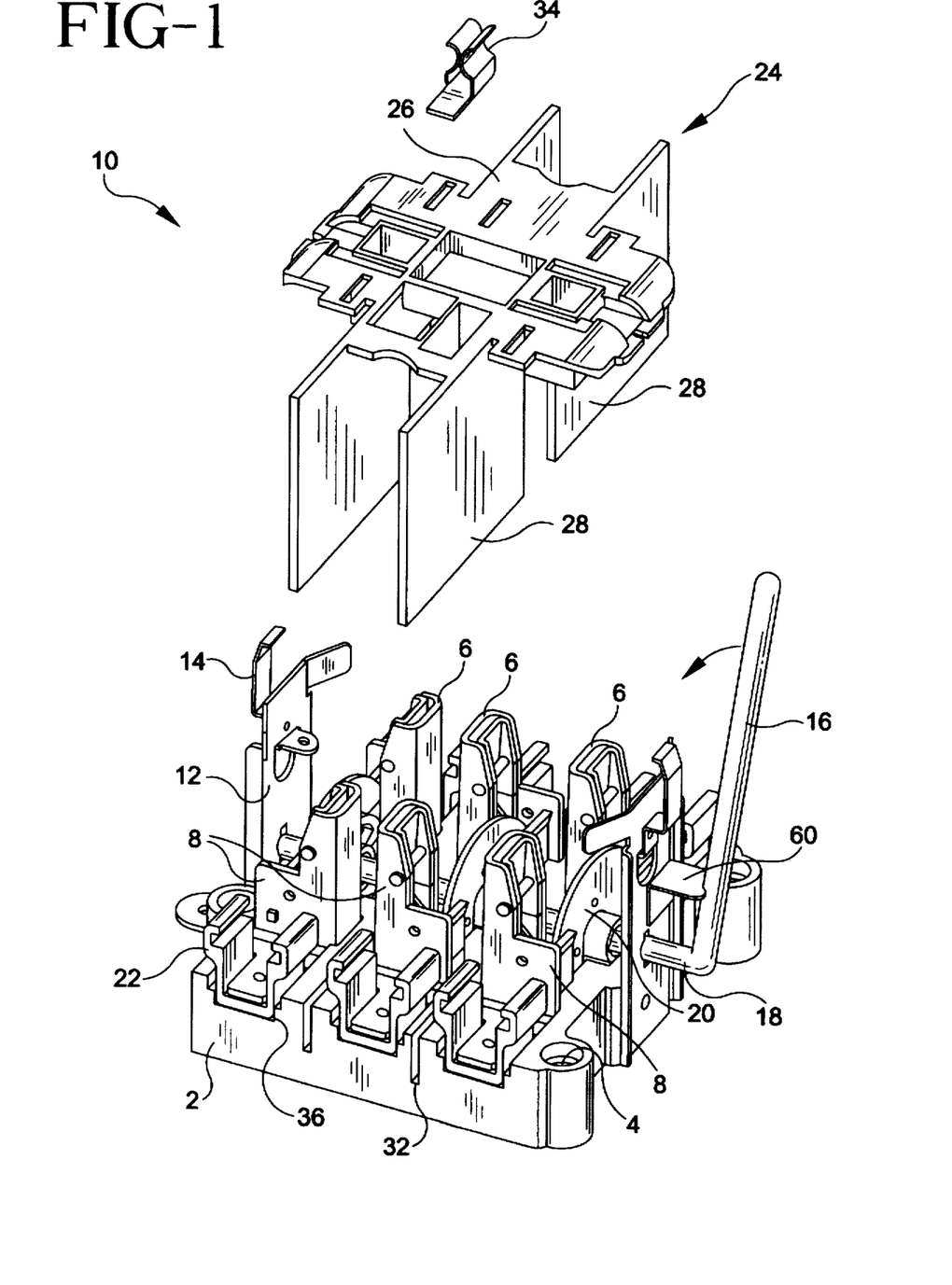
FIG. 1 is an exploded perspective view of the meter socket formed in accordance with the present invention.

Referring to FIG. 1, the meter socket assembly 10 is designed to be bolted to the back wall of the enclosure. The meter socket assembly generally includes an insulative base or block assembly 2 having mounting holes 4 therein for mounting the assembly to an enclosure. The meter block assembly 10 also includes a plurality of jaw-type releasable contacts for receiving the bayonet or blade contacts of a watt-hour meter. More specifically, the assembly includes three line side contact assemblies 6 and three load side contact assemblies 8. So that a meter may be mounted and held on the meter socket assembly 10, a pair of mounting brackets 12 are provided. The mounting brackets include holding clips 14 which are designed to hold the meter in place even if the meter socket assembly is in the bypass position, thus releasing the jaws of the contacts from clamping the meter blades.

The meter socket assembly 10 is equipped with a meter bypass which permits changing or testing of the meter without interrupting service to the load end. The meter bypass assembly includes a bypass lever arm 16 connected to a shaft 18 having mounted thereon bypass cams 20. In the bypass mode of operation, the jaws of the contact assemblies 6, 8 are opened releasing the meter blades and the line and load contacts of the same phase are shorted by the associated bypass cam.

In order to connect the line and load conductors to the meter block assembly, each jaw-type contact assembly has associated therewith a conductor terminal 22. Preferably, the conductor terminal is a lay-in terminal for receiving a conductor wires (not shown) of various sizes. The lay-in terminal may be of any desired construction. The conductor terminals 22 as shown in FIG. 1 have a longitudinal opening into which the wire is laid and a top portion (not shown) which slides into the conductor terminal. The top portion includes a clamping screw (also not shown) for securing the conductor within the lay-in terminal.

The meter block assembly 10 further includes a clear polycarbonate shield 24 for electrically separating each of the contact assemblies and conductor terminals for each phase from the other phases. Since the shield 24 is formed of a clear plastic, the bypass cam is always visible so that a visual determination can be made as to the status of the meter socket, e.g., normal operation mode or bypass mode. The shield 24 includes a top portion 26 having four legs 28 depending perpendicularly therefrom. The legs 28 are spaced so that upon insertion into the meter block assembly 10, each phase of electrical power is separated by a shield leg 28. The insulative block 2 includes slots 32 formed therein for receiving a bottom portion of each of the legs 28 of the shield 24.

The meter socket assembly 10 also includes an insulated seventh terminal 34 which is housed within a cavity in the shield 24. The seventh terminal is fully insulated from the remainder of the meter socket assembly.

Figure 2:
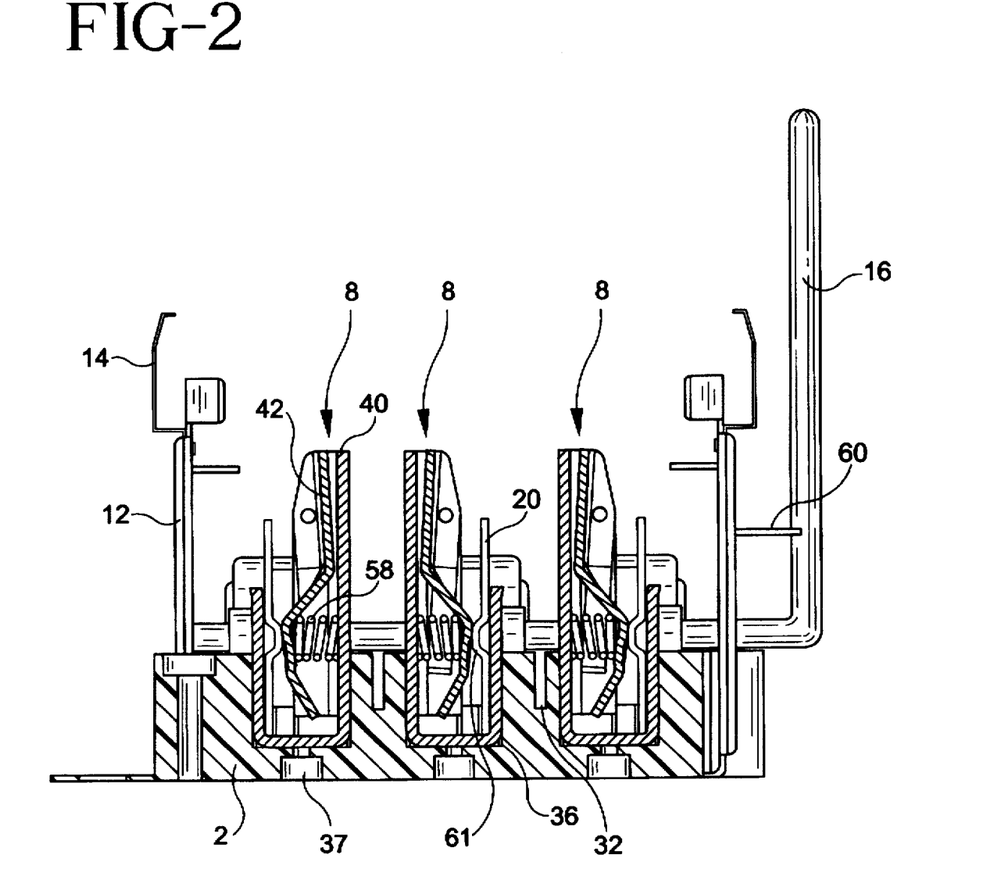
FIG. 2 is a cross-sectional view taken through the load end contact assemblies of the meter socket formed in accordance with the present invention with the protective shield removed.

FIG. 2 is a cross-sectional view taken through the load end contact assemblies 8 of the meter socket assembly formed in accordance with the present invention. The insulative base 2 of the meter socket assembly includes a series of cavities 36 (FIG. 1 and FIG. 2) recessed into the block for receiving each of the contact assemblies mounted to the block. More specifically, the block includes a deep recess for receiving a bottom portion of the jaw-type contacts (FIG. 2) as well as stepped recess portion for receiving the conductor terminal portion (FIG. 1) associated with each of the contact assemblies. The contact assemblies are bolted to the socket block 2 using screws inserted into openings 37 in a bottom portion of the block.

A problem associated with presently available meter sockets is that the contact assemblies and conductor terminals are bolted to a substantially planar top surface of an insulative block by means of several small screws. Accordingly, when conductors are being attached to the conductor terminals, the force exerted on the conductor terminals to lock the conductor in place creates a rotational force on the several small mounting screws possibly causing breakage of the screws. Furthermore, the rotational force of connecting the conductor to the terminal may also cause misalignment of the blade receiving contacts of the meter socket by twisting them from their original positions. Misalignment of the contact assemblies of the meter socket may prevent installation of the meter.

The present invention including recessed cavities 36 for receiving and holding the contacts 6, 8 and conductor terminals 22 provides positive resistance against rotational forces which may be exerted on these components when a conductor is being attached to the conductor terminals. Furthermore, proper alignment of the contacts 6, 8 is assured by the contact assemblies being nested in cavities 36 the in meter block 2. A further advantage of the present invention is that a slight clearance can be provided on the base cavities 36 allowing the meter blades to cause self-alignment with the contact assemblies 6, 8 of the meter socket. Furthermore, spacing between the conductors is also kept uniform by the nesting of the conductor terminals 22 in the cavities 36 formed in the insulative block 2.

Figure 3:
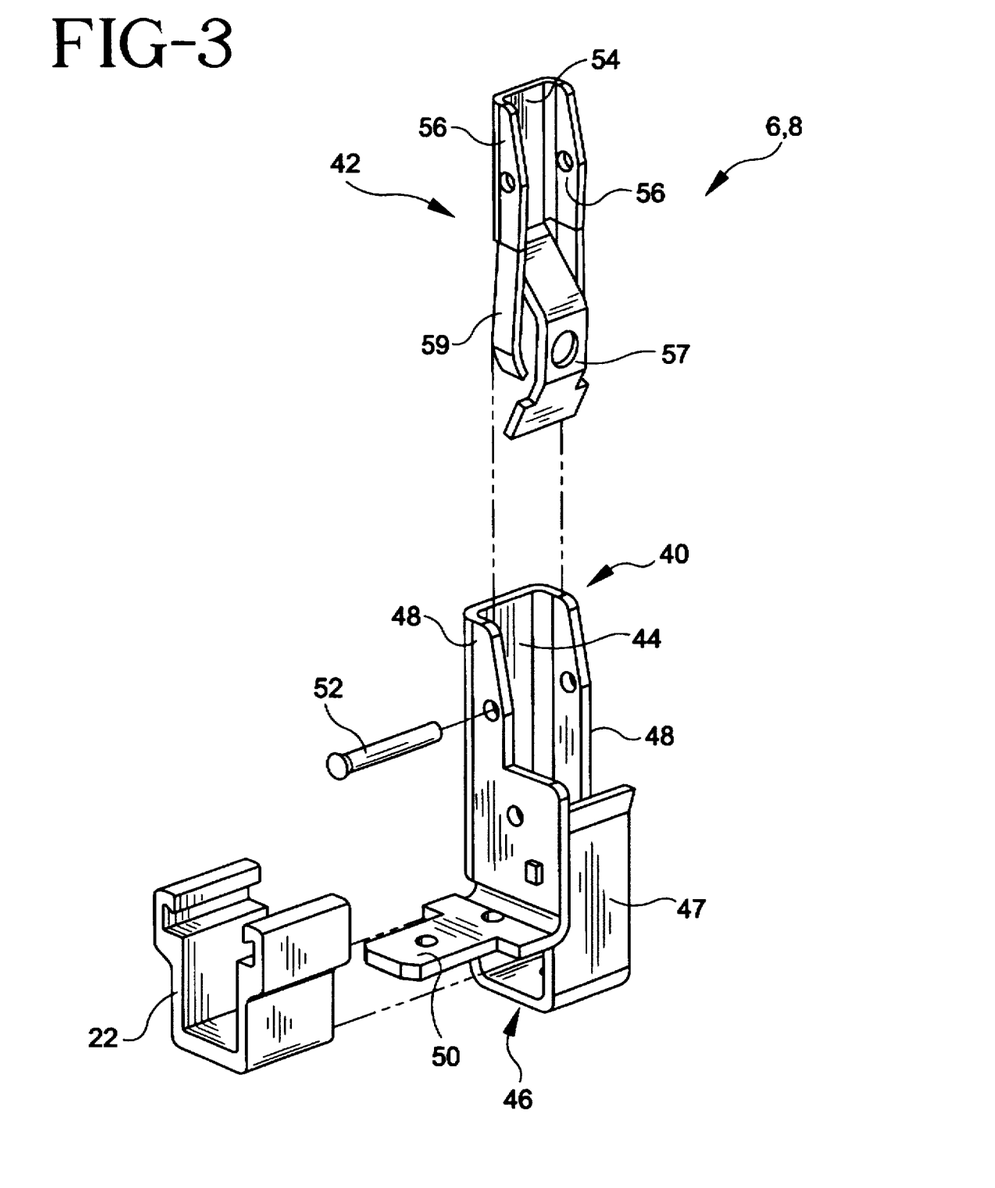
FIG. 3 is an exploded perspective view of the jaw-type contact assembly and conductor terminal assembly formed in accordance with the present invention.

Referring to FIG. 3, the jaw-type contact assembly of the present invention is shown in a perspective exploded view. The contact assembly 6, 8 generally includes three component parts, a stationary contact 40, a moveable contact 42 and a conductor terminal 22. The stationary contact 40 is preferably a one-piece construction having an elongate body 44 and a generally unshaped bottom portion 46 having a vertical extension member 47. The elongate body 44 includes a pair of wings 48 which extend perpendicular to the elongate body 44. One wing has associated therewith a tab 50 to which the conductor terminal is mounted. Preferably, the stationary contact is stamped and bent into shape from a single piece of conductive metal, such as copper.

Also shown in FIG. 3 is the move able contact 42 which is pivotably connected to the stationary contact 40 by pivot pin 52. The moveable contact 42 is also preferably a one-piece construction. The moveable contact 42 includes a back portion 54 having a pair of wings 56 extending substantially perpendicular to the back portion 54. The low portion 57 of the moveable contact is bent for receiving a biasing means, such as a spring, to bias the upper portion of the moveable contact 42 to be in a clamped position with respect to the stationary contact 40. The moveable contact further includes supplemental contact arms 59 which extend downwardly from the wings 56. The supplemental contact arms 59 are bent so that upon insertion into the stationary contact 40, the supplemental contact arms 59 are in electrical contact with the wings 48 of the stationary contact.

Previously available meter sockets included multiple component contacts. These multiple component contacts are possible causes of high resistance problems. More specifically, the components of the contacts may be brazed, staked or riveted to be held together. At these junctions, a poorly done braze, or a poorly assembled riveted junction may cause high resistance and a potential point of failure. To overcome this disadvantage, the present invention utilizes a one-piece construction stationary contact and a one-piece construction moveable contact. The one-piece construction eliminates any potential for failure with respect to assembly of component parts.

As described above, the moveable contact of the present invention includes supplemental contact arms 59 which are in electrical connection with the stationary contact 40. In previous designs, the moveable contact was made from steel or aluminum and did not include any supplemental contact arms. These prior art designs may cause some of the current to flow through the moveable contact biasing means, such as the spring and, under certain conditions, could cause the spring to overheat due to excessive current flowing therethrough. The present invention overcomes this disadvantage and provides the advantage of dividing the current path between the stationary 40 and moveable contacts 42 of the contact jaw assembly. More specifically, the current flows through both the stationary contact and the moveable contact through the supplemental contact arms. By splitting the current path, heating of the contacts due to high current passing through the contact assemblies is greatly reduced. Furthermore, current flow through the spring is avoided since current will take the path of least resistance through the supplemental contact arms 59 which are in electrical contact with the stationary contact 40.

Referring back to FIG. 2, the jaw-type contact assembly is shown in cross-section illustrating the spring 58 which biases the moveable contact 42 against the stationary contact 40 under normal conditions. FIGS. 1 and 2 illustrate the meter socket assembly of the present invention in the bypass mode. More specifically, the bypass lever arm 16 has been placed in the bypass position so that the bypass cams 20 have been rotated so that they are in electrical contact with both the line and load side contact assemblies 6, 8 associated with each phase of the power system. As shown in FIGS. 1 and 2, the meter mounting bracket 12 includes a positive interlock 60 for maintaining the bypass lever arm 16 in the bypass position. In order to move the lever out of the bypass position, the lever must be urged out of its positively interlocked position with the lever interlock 60 and moved in the direction of the arrow shown in FIG. 1 to the normal operation mode.

The bypass cams 20 formed in accordance with the present invention are substantially semi-circular in shape and include rounded lobes 61 projecting outwardly from the generally planar surface of the bypass cams. Upon rotation into contact with the contact assemblies the lobes of the bypass cams move the clamped moveable jaw into a released position by compressing the spring 58 thereby pivoting the moveable contact 42 away from the stationary contact 40 to release the blade of a meter positioned therein. The bypass cam 20 is electrically coupled to both the moveable and stationary contacts and short circuits the contact assemblies of the same phase.

The circuit bypass cams 20 formed in accordance with the present invention are designed so that the cams are permanently engaged with the load end stationary contacts 8 both under normal operation and in the bypass mode. However, due to the shape of the bypass cam, i.e., the rounded lobe which protrudes from a surface of the bypass cam, the jaw-type contact assembly is in a clamped position when the bypass cam is placed in the normal operating position. Only when the lobe 61 of the bypass cam 20 is rotated to be in contact with a lower portion of the movable contact is the spring compressed releasing the jaw assembly.

Figure 4:
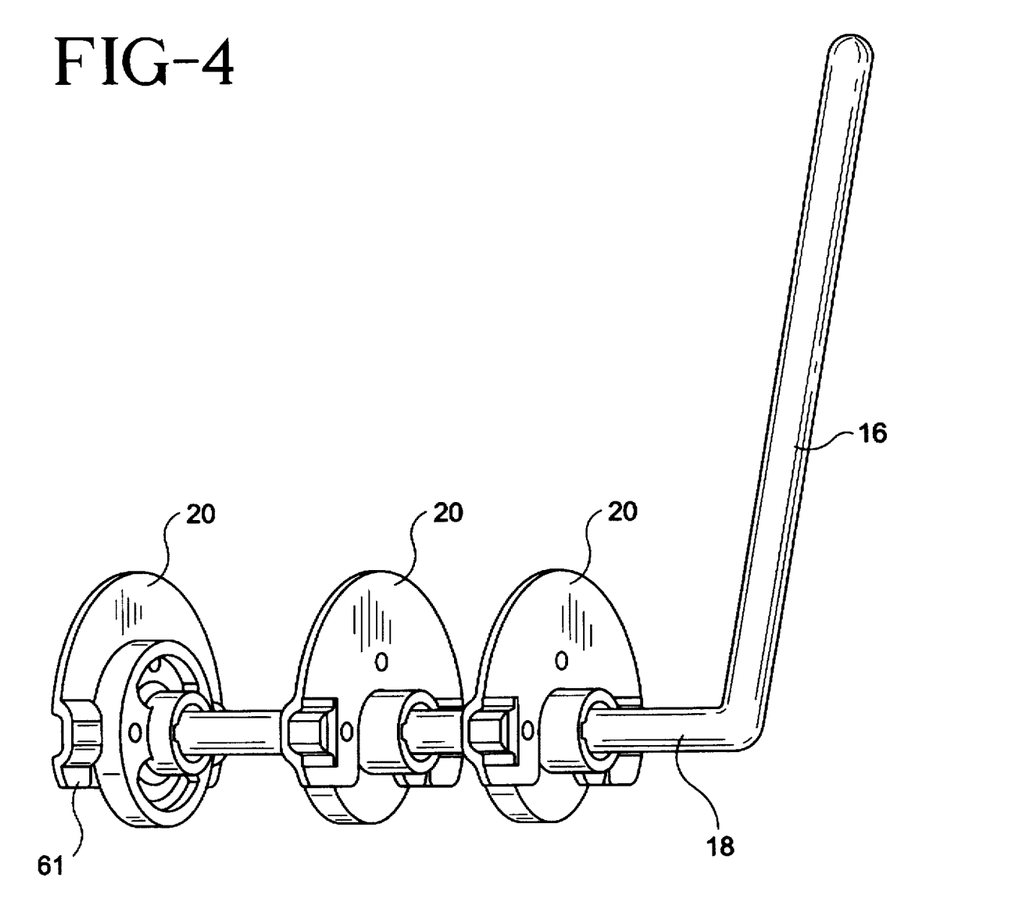
FIG. 4 is a perspective view of a bypass mechanism formed in accordance with the present invention.

FIG. 4 is a perspective view of the bypass mechanism including the bypass lever 16 and associated shaft 18 with the bypass cams 20 mounted thereon. The bypass cams 20 are mounted on the shaft so that the two lobes 61 on each of the bypass cams are approximately 180° apart. The bypass cams illustrated in FIG. 4 will engage the three line end stationary contacts 6 simultaneously upon operation of the bypass mechanism from the normal position to the bypass position. Accordingly, since the circuit bypass cams 20 are permanently engaged with the load end stationary contacts 8, it is only necessary to engage the three line end contacts 6 to effect the bypass. Thus, if arcing occurs, it is confined to the three line end contacts as opposed to all six contacts being subject to arcing which was the case in previously available bypass meter sockets.

Figure 5:
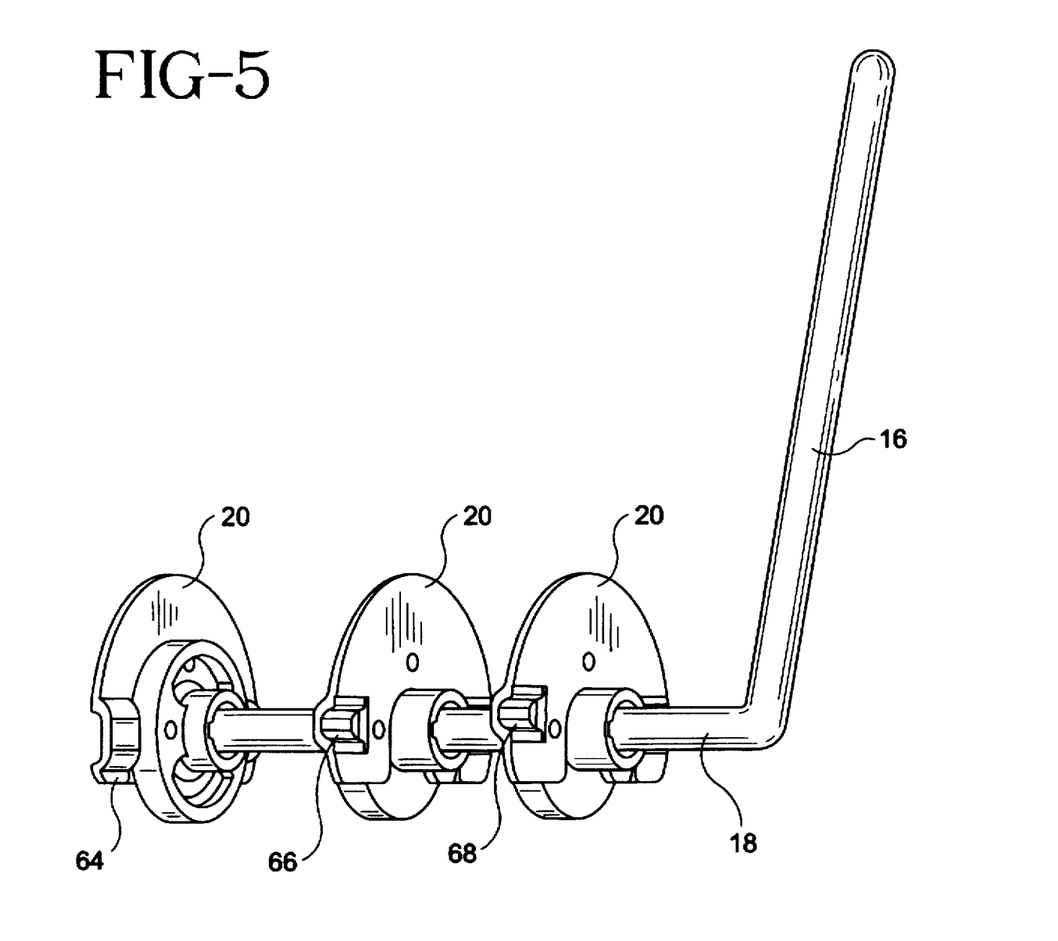
FIG. 5 is a perspective view of an alternative bypass mechanism which has sequentially engaging lobes formed in accordance with the present invention.

Alteratively, the lobes of the bypass cams 20 may be so arranged so that the cam lobes engage the line end contacts 6 sequentially. This may be accomplished either by arranging the cams in a slightly staggered configuration or providing cams such that one cam has an extended lobe to engage the line end contact first, a second cam has a smaller lobe 66 to engage its associated line end contact second and the third has yet a smaller lobe 68 to engage the associated contact assembly last in sequence with the other two. This type of arrangement reduces the force necessary to overcome the force of the springs simultaneously to release the jaw-type contacts of each of the contact assemblies by causing the cam lobes to compress only one spring at a time until all six springs are compressed. The high force required to place the meter socket in the bypass position of older designs has been a known problem. The present invention overcomes this problem through the use of sequenced lobes positioned on the bypass cams.

The meter socket formed in accordance with the present invention is rated for 200 amps continuous, 600 volts ac maximum. The socket assembly is designed for use with three phase four wire power systems in either a delta or wye configuration. Furthermore, the bypass is designed to carry full rated current. The lay-in connectors are rated for 6-350 MCM cables.

The meter socket assembly of the present invention overcomes several disadvantages of previously available meter sockets. More specifically, the one piece construction of the stationary contacts effectively eliminates the problems associated with multiple component contacts which must be brazed, staked or riveted at various junctions thus creating a potential point of failure due to high resistance at that junction. Furthermore, the one piece construction of the copper movable contact having supplemental contact arms allows the current path to be divided so that current flows through both the stationary and movable contacts in the contact jaw assembly. By splitting the current path, heating of the contacts due to high current is greatly reduced.

Additionally, the problems associated with alignment of the meter socket jaws as well as rotational forces applied to the contact assemblies during connection of conductors to the lay-in conductor terminals have been overcome by the present invention. Specifically, the present invention includes recessed cavities formed in the insulative block for mounting the contact assemblies therein. By nesting the contact assemblies in these cavities, a positive resistance against rotational forces which are exerted when a cable is being attached to the connector assembly is provided. Furthermore, by nesting the lay-in conductor terminals in cavities in the block, uniform spacing between all phases can be maintained.

The present invention also provides a unique bypass assembly including bypass cams mounted on a shaft attached to the bypass lever arm. The bypass cams are designed so that the cams are in permanent electrical engagement with the load end stationary contacts. Since the cams are always engaged with the load end stationary contacts, positive alignment of the bypass cams with the jaw assemblies is achieved. As previously discussed, another advantage is that it is only necessary to engage the three line end contacts to place the meter socket in the bypass mode since the bypass cams are always engaged with the three load end contacts. Thus, arcing, if it occurs, is confined to the three line end contacts.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. A meter socket assembly comprising:
   a block of insulative material;
   a plurality of line and load jaw-type releasable contacts for receiving the blades of a meter, each of said contacts being mounted on said block and including a stationary contact and a movable contact mechanically and electrically connected to the stationary contact;
   means resiliently biasing each of said movable contacts to be in clamped relation with its associated stationary contact; and
   meter bypass means including bypass cams coupled to a manually rotatable shaft, the bypass cams being movable from an operating position whereby the jaw-type contacts are clamped and current flows through a meter and a bypass position in which the bypass cams are electrically shorting the line and load end contacts for changing or testing a meter without service interruption,
   wherein each of said stationary contacts is stamped from a conductive material and bent into shape to form a one-piece contact thereby eliminating areas of high resistance and potential failure points due to multi-component assembly.

2. A meter socket assembly as defined in claim 1, wherein the bypass cams are permanently electrically coupled with the load end stationary contacts.

3. A meter socket assembly as defined in claim 1, wherein the bypass cams are semi-circular in shape.

4. A meter socket assembly as defined in claim 1, wherein the bypass cams include lobes positioned thereon, the bypass cam lobes being arranged to engage the line side contacts sequentially upon operation of the bypass means thereby reducing the force necessary to overcome the biasing means associated with each of the moveable contacts of the releasable contacts.

5. A meter socket assembly as defined in claim 1, wherein the bypass cams include lobes positioned thereon, the bypass cam lobes being arranged to engage the line side stationary contacts simultaneously upon operation of the bypass means.

6. A meter socket assembly as defined in claim 1, wherein each of the movable contacts is formed in a one-piece construction.

7. A meter socket assembly as defined in claim 6, wherein each of the movable contacts includes supplemental contact arms which are in electrical contact with the stationary contacts so that current flow is substantially divided between the stationary contact and the moveable contact.

8. A meter socket assembly as defined in claim 1, wherein each of the stationary contacts include an elongate body having a substantially U-shaped lower portion having a mounting means provided thereon, the elongate body further including wings extending substantially perpendicular to the body on opposite side portions thereof.

9. A meter socket assembly as defined in claim 8, wherein the block includes a plurality of recessed cavities formed therein for receiving and holding in proper alignment the lower portion of the stationary contacts.

10. A meter socket assembly as defined in claim 8, wherein the stationary contact further includes a conductor terminal, and wherein the block includes a plurality of recessed cavities formed therein for receiving the lower portion of the stationary contacts and the conductor terminal, the cavities in the block providing positive resistance against rotational forces exerted on the stationary contact when a cable is being attached to the conductor terminals and maintaining accurate alignment of the jaw-type contacts.

11. A meter socket assembly as defined in claim 1, further comprising a meter socket bracket coupled to the block for supporting a meter on said socket assembly when the bypass means is in the bypass position.

12. A meter socket assembly as defined in claim 11, wherein the meter socket bracket includes means for providing a positive interlock with an operating handle of the meter bypass means.

13. A meter socket assembly comprising:
a block of insulative material;
a plurality of line and load jaw-type releasable contacts for receiving the blades of a meter, each of said contacts being mounted on said block and including a stationary contact having an elongate body with a pair of wings extending substantially perpendicular to the body and a movable contact mechanically and electrically connected to the stationary contact;
means resiliently biasing each of said movable contacts to be in clamped relation with its associated stationary contact; and
meter bypass means including bypass cams coupled to a manually rotatable shaft, the bypass cams being movable from an operating position whereby the jaw-type contacts are clamped and current flows through a meter and a bypass position in which the bypass cams are electrically shorting the line and load end contacts for changing or testing a meter without service interruption,
wherein each of the movable contacts includes a back portion having a pair of wings extending substantially perpendicular to the back portion and supplemental contact arms extending downwardly from the wings, the supplemental contact arms electrically engaging the wings of the stationary contacts so that current flow is substantially divided between the stationary contact and the moveable contact.

14. A meter socket assembly comprising:
a block of insulative material;
a plurality of line and load jaw-type releasable contact assemblies for receiving the blades of a meter, each of said contact assemblies including means for mounting the contacts to said block at a lower portion of said contact assembly, each of said contact assemblies including a stationary contact and a movable contact mechanically and electrically connected to the stationary contact;
means resiliently biasing each of said movable contacts to be in clamped relation with its associated stationary contact; and
meter bypass means including bypass cams coupled to a manually rotatable shaft, the bypass cams being movable from an operating position whereby the jaw-type contacts are clamped and current flows through a meter and a bypass position in which the bypass cams are electrically shorting the line and load end contacts for changing or testing a meter without service interruption,
wherein the block includes a first plurality of recessed cavities formed therein for receiving the lower portion of each of the jaw-type contact assemblies the cavities including upstanding walls for holding said contact assemblies in proper alignment.

15. A meter socket assembly as defined in claim 14, wherein the stationary contact further includes a conductor terminal, and wherein the block includes a second plurality of recessed cavities formed therein for receiving the conductor terminal, such that the walls of the second cavities in the block provide positive resistance against rotational forces exerted on the stationary contact when a cable is being attached to the conductor terminals.

16. A meter socket assembly comprising:
a block of insulative material;
a plurality of line and load jaw-type releasable contacts for receiving the blades of a meter, each of said contacts being mounted on said block and including a stationary contact and a movable contact mechanically and electrically connected to the stationary contact;
means resiliently biasing each of said movable contacts to be in clamped relation with its associated stationary contact; and
meter bypass means including bypass cams coupled to a manually rotatable shaft, the bypass cams being movable from an operating position whereby the jaw-type contacts are clamped and current flows through a meter and a bypass position in which the bypass cams are electrically shorting the line and load end contacts for changing or testing a meter without service interruption,
wherein the bypass cams are permanently electrically coupled with the load end stationary contacts.

17. A meter socket assembly as defined in claim 16, wherein the bypass cams include lobes positioned thereon, the bypass cam lobes being arranged to engage the line side contacts sequentially upon operation of the bypass means thereby reducing the force necessary to overcome the biasing means, associated with each of the moveable contacts of the contact assembly.

18. A meter socket assembly as defined in claim 16, wherein the bypass cams include lobes positioned thereon, the bypass cam lobes being arranged to engage the line side stationary contacts simultaneously upon operation of the bypass means.

19. A meter socket assembly comprising:
a block of insulative material;

a plurality of line and load jaw-type releasable contacts for receiving the blades of a meter, each of said contacts being mounted on said block and including a stationary contact and a movable contact mechanically and electrically connected to the stationary contact;

means resiliently biasing each of said movable contacts to be in clamped relation with its associated contact with said stationary contact;

meter bypass means including bypass cams coupled to a manually rotatable shaft, the bypass cams being movable from an operating position whereby the jaw-type contacts are clamped and current flows through a meter and a bypass position in which the bypass cams are electrically shorting the line and load end contacts for changing or testing a meter without service interruption; and a meter socket bracket coupled to the block for supporting a meter on said socket assembly, the meter socket bracket including means for providing a positive interlock with an operating handle of the meter bypass means.

20. A meter socket assembly comprising:

a block of insulative material;

a plurality of line and load jaw-type releasable contacts for receiving the blades of a meter, each of said contacts being mounted on said block and including a stationary contact and a movable contact mechanically and electrically connected to the stationary contact;

means resiliently biasing each of said movable contacts to be in clamped relation with its associated stationary contact; and meter bypass means including bypass cams coupled to a manually rotatable shaft, the bypass cams being movable from an operating position whereby the jaw-type contacts are clamped and current flows through a meter and a bypass position in which the bypass cams are electrically shorting the line and load end contacts for changing or testing a meter without service interruption.

wherein the bypass cams include lobes positioned thereon, the bypass cam lobes being arranged to engage the line side contacts sequentially upon operation of the bypass means thereby reducing the force necessary to overcome the biasing means associated with each of the moveable contacts of the releasable contacts.

\* \* \* \* \*